US009410999B2

(12) United States Patent
Alatas et al.

(10) Patent No.: US 9,410,999 B2
(45) Date of Patent: Aug. 9, 2016

(54) CONTACTLESS CAPACITIVE DISTANCE SENSOR

(75) Inventors: Fatih Alatas, Munich (DE); Martin Kördel, Munich (DE); Anton Schick, Velden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 339 days.

(21) Appl. No.: 14/241,369

(22) PCT Filed: Aug. 2, 2012

(86) PCT No.: PCT/EP2012/065170
§ 371 (c)(1),
(2), (4) Date: Feb. 26, 2014

(87) PCT Pub. No.: WO2013/029915
PCT Pub. Date: Mar. 7, 2013

(65) Prior Publication Data
US 2014/0218056 A1     Aug. 7, 2014

(30) Foreign Application Priority Data

Aug. 26, 2011   (DE) .................. 10 2011 081 666

(51) Int. Cl.
*G01R 27/26*     (2006.01)
*G06K 9/00*      (2006.01)
(Continued)

(52) U.S. Cl.
CPC ............ *G01R 27/2605* (2013.01); *G01B 7/023* (2013.01); *G01B 7/08* (2013.01); *G01D 5/24* (2013.01); *G06F 3/0414* (2013.01); *G06K 9/0002* (2013.01); *G01R 31/312* (2013.01)

(58) Field of Classification Search
CPC ....... G01D 5/24; G01D 5/241; G01D 5/2412; G01D 5/2417; G01R 27/26; G01R 27/2605; G01R 31/312; G01B 7/023; G01B 7/08; G06K 9/0002; G06F 3/0414; G06F 2203/04103; H03K 17/955; H03K 2217/960725; G01L 1/146
USPC ......... 324/600, 649, 658, 661, 662, 679, 686; 702/47, 52; 345/173, 174
See application file for complete search history.

(56) References Cited

U.S. PATENT DOCUMENTS 4,924,172 A * 5/1990 Holmgren ............ G01D 5/2417
                                                   324/664
4,958,129 A   9/1990 Poduje et al.
(Continued)

FOREIGN PATENT DOCUMENTS

CN    1782721      6/2006
CN    101685119    3/2010
(Continued)

OTHER PUBLICATIONS

Office Action dated Apr. 30, 2015 in corresponding Chinese Patent Application No. 201280041589.9.
(Continued)

*Primary Examiner* — Hoai-An D Nguyen
(74) *Attorney, Agent, or Firm* — Slayden Grubert Beard PLLC

(57) ABSTRACT

Electrically conductive structures produced on or in a substrate, or produced such that the structures are floating in a substrate undergo simple and reliable capacitive contactless and non-destructive inspection using a capacitive sensor having at least two sensor electrode surfaces which are arranged at different constant distances from one another parallel to a surface of the substrate and are arranged beside one another relative to the surface of the substrate.

32 Claims, 6 Drawing Sheets

(51) Int. Cl.
  *G01D 5/24* (2006.01)
  *G06F 3/041* (2006.01)
  *G01B 7/02* (2006.01)
  *G01B 7/06* (2006.01)
  *G01R 31/312* (2006.01)

(56) References Cited

U.S. PATENT DOCUMENTS

| | | | |
|---|---|---|---|
| 7,558,045 B1 | 7/2009 | Onate et al. | |
| 8,436,823 B2 | 5/2013 | Kanehira et al. | |
| 2002/0140442 A1* | 10/2002 | Ishioka | G01R 31/312 324/754.21 |
| 2002/0163342 A1* | 11/2002 | Ishioka | G01R 31/2805 324/527 |
| 2006/0043153 A1* | 3/2006 | Yamaoka | G01R 31/2805 228/10 |
| 2006/0119369 A1 | 6/2006 | Kawahata et al. | |
| 2011/0148811 A1 | 6/2011 | Kanehira et al. | |

FOREIGN PATENT DOCUMENTS

| | | |
|---|---|---|
| CN | 101978466 | 2/2011 |
| CN | 102103445 | 6/2011 |
| DE | 102009022965 A1 | 12/2010 |
| DE | 102011081666.6 | 8/2011 |
| JP | 61-81183 | 5/1986 |
| JP | 6-308530 | 11/1994 |
| JP | 7-161790 | 6/1995 |
| JP | 8-136209 | 5/1996 |
| JP | 2001-330406 | 11/2001 |
| JP | 2010-224011 | 10/2010 |
| WO | 2010/136330 A1 | 12/2010 |

OTHER PUBLICATIONS

German Translation of Japanese Office Action dated Oct. 19, 2015 in corresponding Japanese Patent Application No. 2014-527566.

German Translation of Japanese Office Action mailed Feb. 16, 2015 in corresponding Japanese Patent Application No. 2014-527566.

International Search Report for PCT/EP2012/065170 dated Nov. 15, 2012.

German OA for Application No. 102011081666.6 dated Jun. 15, 2012.

* cited by examiner

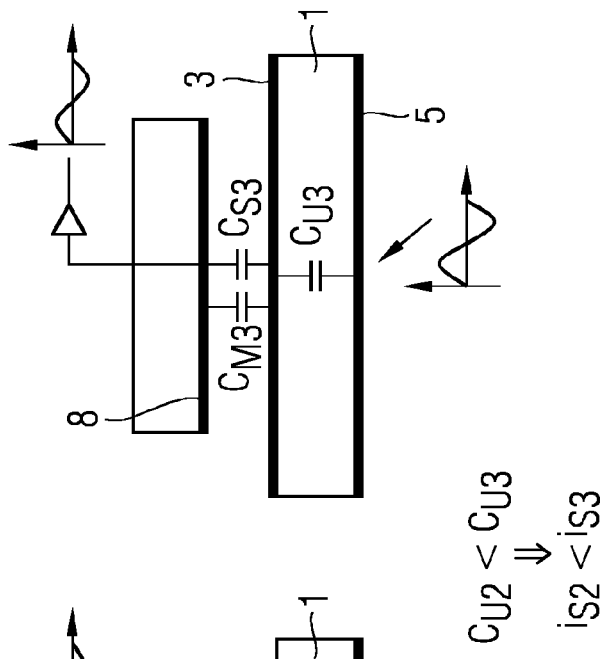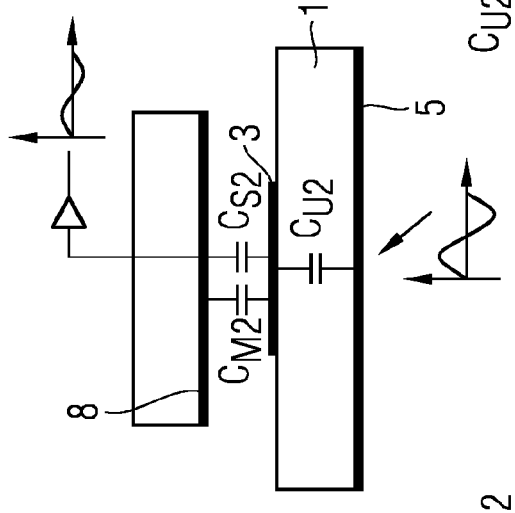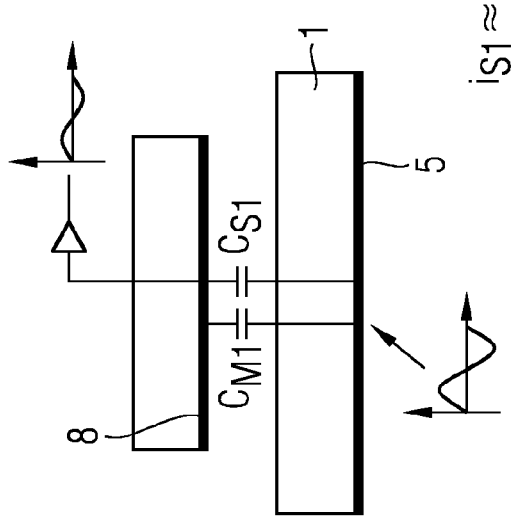

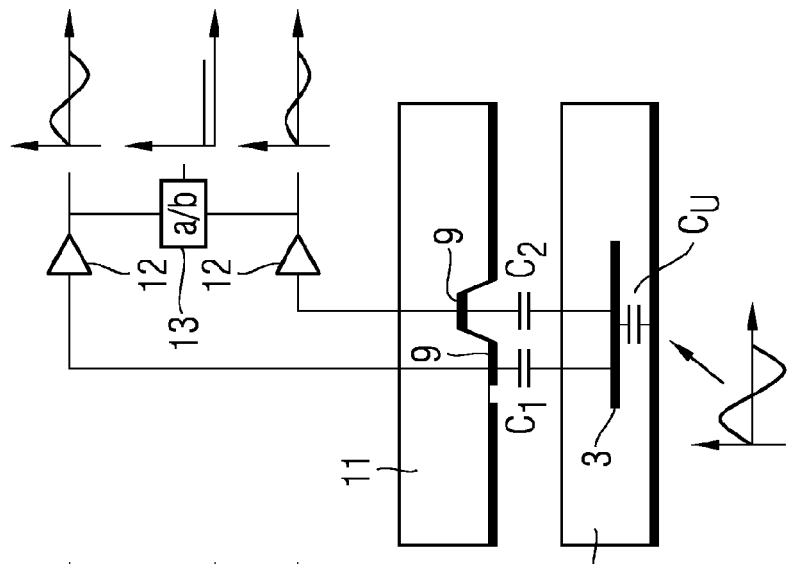
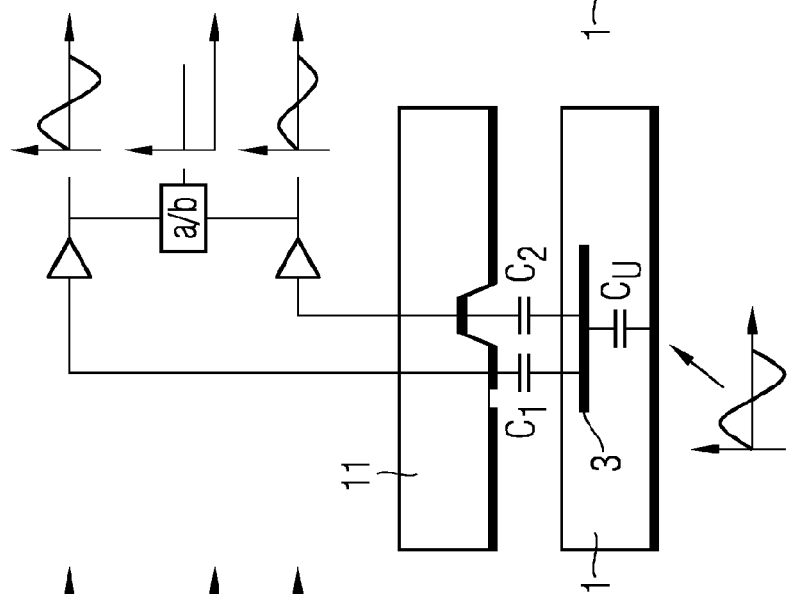
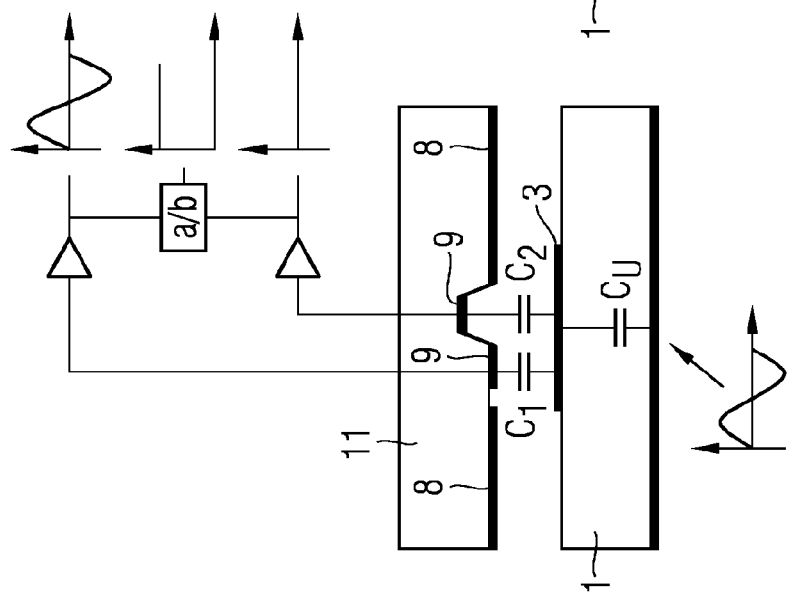

CONTACTLESS CAPACITIVE DISTANCE SENSOR

CROSS REFERENCE TO RELATED APPLICATIONS

This application is the U.S. national stage of International Application No. PCT/EP2012/065170, filed, Aug. 2, 2012 and claims the benefit thereof. The International Application claims the benefits of German Application No. filed on Aug. 26, 2011, both applications are incorporated by reference herein in their entirety.

BACKGROUND

Described below are an apparatus and a method for the contactless and nondestructive inspection of electrically conductive structures produced on or in a substrate or in a manner floating in a substrate.

The method relates, in particular, to the contactless and nondestructive inspection of electrically conductive structures on substrates extending in each case along an area. Corresponding substrates occur for example in so-called display backplanes or printed circuits. An electrical check of corresponding structures before the completion of the entire display is possible only to a limited extent. That applies primarily to structures having lengths in the mm or μm range or without direct contact with the edge of a substrate.

An electrically conductive structure is floating when it is completely enclosed in a substrate, has no direct contact with an edge or surface of the substrate and is electrically insulated.

One possibility for checking the electrical functionality is to use a known needle test. This involves pressing needles onto the corresponding conductive areas in the substrates and producing electrical connections. Afterward, it is possible to examine the structure between the needle contacts for electrical conductivity or with regard to the functionality. However, such a method has some disadvantages. Making contact without damage is not possible, or is possible only to a limited extent. Furthermore, the contact-making itself is likewise comparatively complex. In this regard, the needles have to be accurately aligned and ensure the contact-making with a defined pressure. In this case, the needles likewise experience mechanical wear. On account of this complex process, the inspection of many areas and thus an "inline" inspection can be efficiently implemented only to a limited extent.

A further known measuring method is optical inspection. The latter cannot make any statement about the electrical properties or about entirely satisfactory functionality. However, it is suitable for material inspection. It is thereby possible to check the lateral geometry of structures. Cracks in electrically conductive structures or short circuits in lower layers between deeper conductor tracks, which lead to faulty behavior, cannot, however, be reliably identified.

A further known solution is so-called contactless capacitive inspection. In this case, a capacitance dependent on the location is formed between the substrate surface and the sensor. Voltage and capacitance changes can subsequently be detected from this capacitive coupling. It is thereby possible to capacitively scan the surface of the substrate or to calculate applied voltages on the substrate surface. The substrates have to be correspondingly supplied with signals for corresponding measurements. In the case of capacitive surface scanning, the signal feed to the substrate can likewise be excited capacitively via an electrically conductive bearing area. On account of the capacitive coupling, the measurement signal reacts to changes in conductivity or capacitance and is therefore much better suited to the electrical inspection of corresponding structures than corresponding optical methods. FIG. 2 shows this known method. In this method, however, it is not possible to inspect very small structures which are not electrically connected, that is to say which are floating. Consequently, a signal cannot be directly applied to the structures. A capacitive coupling via the substrate receptacle is not possible in this case. For a measurable signal, the coupling area of the substrate receptacle has to be decisively greater than the coupling area with respect to the sensor, otherwise the difference between the measurement results "structure present" and "structure not present" cannot be measured.

SUMMARY

Described below is contactless and nondestructive inspection of electrically conductive structures in such a way that in a Cartesian x-, y-, z-coordinate system an extent of an electrically conductive structure along the z-axis and/or an extent of the electrically conductive structure along the x-, y-plane are/is detected simply and reliably. The intention is to enable a multiplicity of electrically conductive structures to be inspected effectively. The intention is to reliably identify for example cracks in the electrically conductive structures or short circuits between conductor tracks situated in a substrate. The intention is to enable electrical structures on or in a substrate and floating electrical structures to be inspected. The intention is to enable display substrates and printed circuits, for example, to be inspected.

As described below, an apparatus for capacitive, contactless and nondestructive inspection of a multiplicity of electrically conductive structures produced in a substrate includes an electrically conductive substrate holder, which positions the substrate and to which an excitation signal generated by an excitation signal generating device is applied; a capacitive sensor, which is positioned on that side of the substrate which faces away from the substrate holder, and has at least two sensor electrode areas arranged at mutually different, constant distances parallel to a surface of the substrate and alongside one another relative to the surface of the substrate; a measuring device for detecting a respective sensor measurement signal at a respective sensor electrode area; an evaluation device for determining a spatial extent of an electrically conductive structure by the detected sensor measurement signals.

As also described below, a method for capacitive, contactless and nondestructive inspection of a multiplicity of electrically conductive structures produced on or in a substrate includes positioning the substrate by an electrically conductive substrate holder, to which an excitation signal generated by an excitation signal generating device is applied; positioning a capacitive sensor on that side of the substrate which faces away from the substrate holder, the capacitive sensor having at least two sensor electrode areas arranged at mutually different, constant distances parallel with respect to a surface of the substrate and alongside one another relative to the surface of the substrate; detecting a respective sensor measurement signal at a respective sensor electrode area by a measuring device; determining, performed by an evaluation device, a spatial extent of an electrically conductive structure by the detected sensor measurement signals.

A three-dimensionally fashioned capacitive sensor having sensor electrodes is used. In this case, at least two adjacent sensor electrodes are used, the sensor electrodes having an offset vertically relative to one another. For the measurements, the apparatus has to be positioned or moved at a constant distance above the area to be measured. In this case, capacitive couplings arise between the apparatus and the electrically conductive areas of the substrate. The capacitive coupling between the sensor electrode and the measurement object defines the measurement capacitance. The measurement capacitance turns out to be different between the height-offset sensor electrodes. The sensor electrode areas of the sensor electrodes are height-offset vertically. Given otherwise identical conditions, this difference in the measurement capacitances is dependent on the height offset of the sensor electrode areas and the distance between the sensor and the electrically conductive structures. Since the height offset of the sensor electrode areas is known, the distance between the electrically conductive structures and the sensor can be calculated from the measurement signal and it is possible to determine whether or not an electrically conductive structure is present.

In accordance with the present application, the sensor electrodes are arranged in a height-offset manner with respect to one another, such that the capacitive sensor is configured three dimensionally. In this way, it is possible to calculate the distance from the measurement signals. Thus, it is possible to realize a simple absolute distance measurement directly with respect to the electrically conductive structure and, in a manner derived therefrom, the measurement of a height profile. This does not require contact to be made directly with the substrate for the purpose of signal generation. A signal can likewise be capacitively incorporated by the substrate receptacle, which can be a chuck, for example. It is likewise possible to measure and inspect electrically conductive structures in non-conductive substrates or through the electrical layers. The method measures independently of the structure size, as long as the sensor electrode areas overlap the conductive structure completely or in identical proportions. Since the distance measurement is dependent only on the ratio of the two measurement currents, an arbitrary electrical signal can be applied to the structures. If no signal is present, there is no charge-reversal current. In this case the sensor can be kept at an oscillating potential, if appropriate. The present method does not require knowledge of the magnitude of the excitation voltage. Depending on a working distance, it is possible for the height offset to be adapted to the measurement conditions and optimized.

In accordance with one advantageous configuration, two sensor electrode areas can be formed and the evaluation device can have a divider and can determine a distance h between the sensor and an electrically conductive structure by a ratio of the two sensor measurement signals to one another.

In accordance with a further advantageous configuration, the evaluation device can determine whether or not an electrically conductive structure extends between one of the sensor electrode areas and the substrate holder.

In accordance with a further advantageous configuration, the evaluation device, upon determining a distance h greater than a threshold value, can determine that no electrically conductive structure extends between the assigned sensor electrode and the substrate holder. The threshold value can be, for example, a maximum possible distance between the sensor and the substrate holder.

In accordance with a further advantageous configuration, in a plane of one of the sensor electrode areas, at least one electrically conductive shielding layer can be formed on the sensor. A ground potential can be applied to the electrically conductive shielding layer.

In accordance with a further advantageous configuration, the at least one electrically conductive shielding layer can replace the sensor electrode area lying in the same plane.

In accordance with a further advantageous configuration, the excitation signal can be an alternating voltage and/or current signal.

In accordance with a further advantageous configuration, a sensor measurement signal can be in each case a charge-reversal current.

In accordance with a further advantageous configuration, the sensor electrode areas and the electrically conductive structures can extend parallel to an x-, y-plane of an orthogonal coordinate system.

In accordance with a further advantageous configuration, the sensor electrode areas can be identical in size.

In accordance with a further advantageous configuration, the sensor electrode areas can be congruent to one another.

In accordance with a further advantageous configuration, the sensor electrode areas can together correspond to a surface of the substrate.

In accordance with a further advantageous configuration, the substrate can be a screen glass substrate of a liquid crystal display (LCD) and the electrically conductive structures can be conductor tracks or pixel areas. Substrate and electrically conductive structures can likewise form a printed electronic assembly. The electrically conductive structures can be conductor tracks or pixel areas on TFT electrodes (thin film transistor electrodes).

In accordance with a further advantageous configuration, a relative movement device can relatively move the surface of the substrate and the sensor at a constant distance with respect to one another into a multiplicity of measurement positions.

In accordance with a further advantageous configuration, the sensor can have a multiplicity of groups of sensor electrode areas which cover a surface of the substrate with a regular pattern, and simultaneously can provide a multiplicity of measurement positions.

In accordance with a further advantageous configuration, the regular pattern can cover a surface of the substrate in linear fashion.

BRIEF DESCRIPTION OF THE DRAWINGS

These and other aspects and advantages will become more apparent and more readily appreciated from the following description of the exemplary embodiments, taken in conjunction with the accompanying drawings of which:

FIGS. 2A to 2C show exemplary embodiments of a known contactless capacitive inspection;

FIGS. 4A to 4C show exemplary embodiments of measurements;

DETAILED DESCRIPTION OF THE PREFERRED EMBODIMENT

Figure 1A:
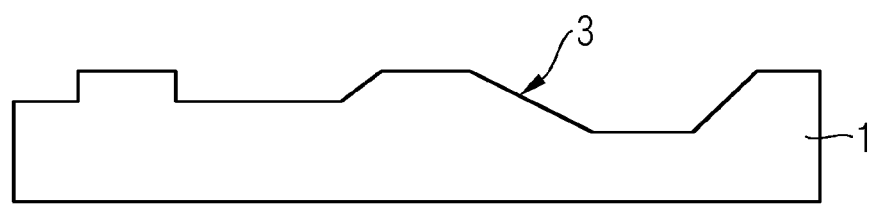
FIGS. 1A and 1B show exemplary embodiments of electrically conductive structures to be inspected.

Reference will now be made in detail to the preferred embodiments, examples of which are illustrated in the accompanying drawings, wherein like reference numerals refer to like elements throughout.

Figure 1B:
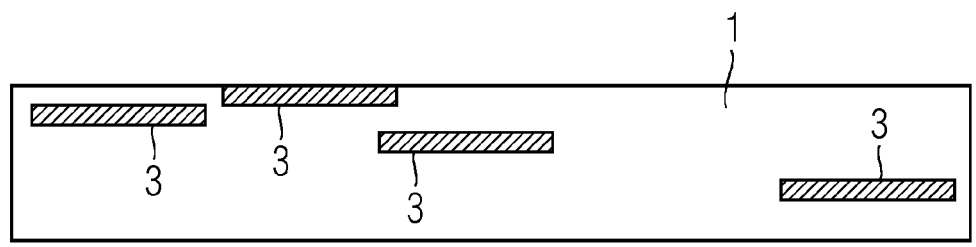

FIGS. 1A and 1B show exemplary embodiments of electrically conductive structures to be inspected. FIG. 1A shows an electrically conductive surface as an exemplary embodiment of an electrically conductive structure. Reference sign 3 here designates the electrically conductive surface. FIG. 1b shows further exemplary embodiments of electrically conductive structures 3. Electrically conductive structures 3 can thus be formed in a substrate 1. Alternatively, electrically conductive structures can likewise be formed on or below the substrate 1. The electrically conductive structures 3 can likewise be provided in a floating manner. The method enables contactless inspection of, in particular small, floating electrically conductive structure areas 3 and furthermore a measurement of a distance between a capacitive sensor and the structured surface of the substrate 1 in accordance with FIG. 1A. By such a distance measurement, it is possible to measure a height as a third dimension of a three-dimensionally electrically conductive structured surface 3 in accordance with FIG. 1A.

A profile measurement can be carried out in this way. Electrically conductive structures 3 in the interior of a dielectric in accordance with FIG. 1b can likewise be measured geometrically, to be precise likewise in the third dimension.

FIGS. 2A to 2C show exemplary embodiments of a known contactless capacitive inspection. A location-dependent capacitance is formed between a surface of a substrate 1 and a sensor. Voltage and capacitance changes can subsequently be detected from this capacitive coupling. A capacitance is furthermore formed between a ground area 8 and a substrate receptacle 5. FIG. 2A shows an arrangement without an electrically conductive structure, FIG. 2B with an electrically conductive structure 3, and FIG. 2C shows the known arrangement with an electrically conductive structure 3 whose area corresponds to the area of a substrate receptacle 5.

Figure 3:
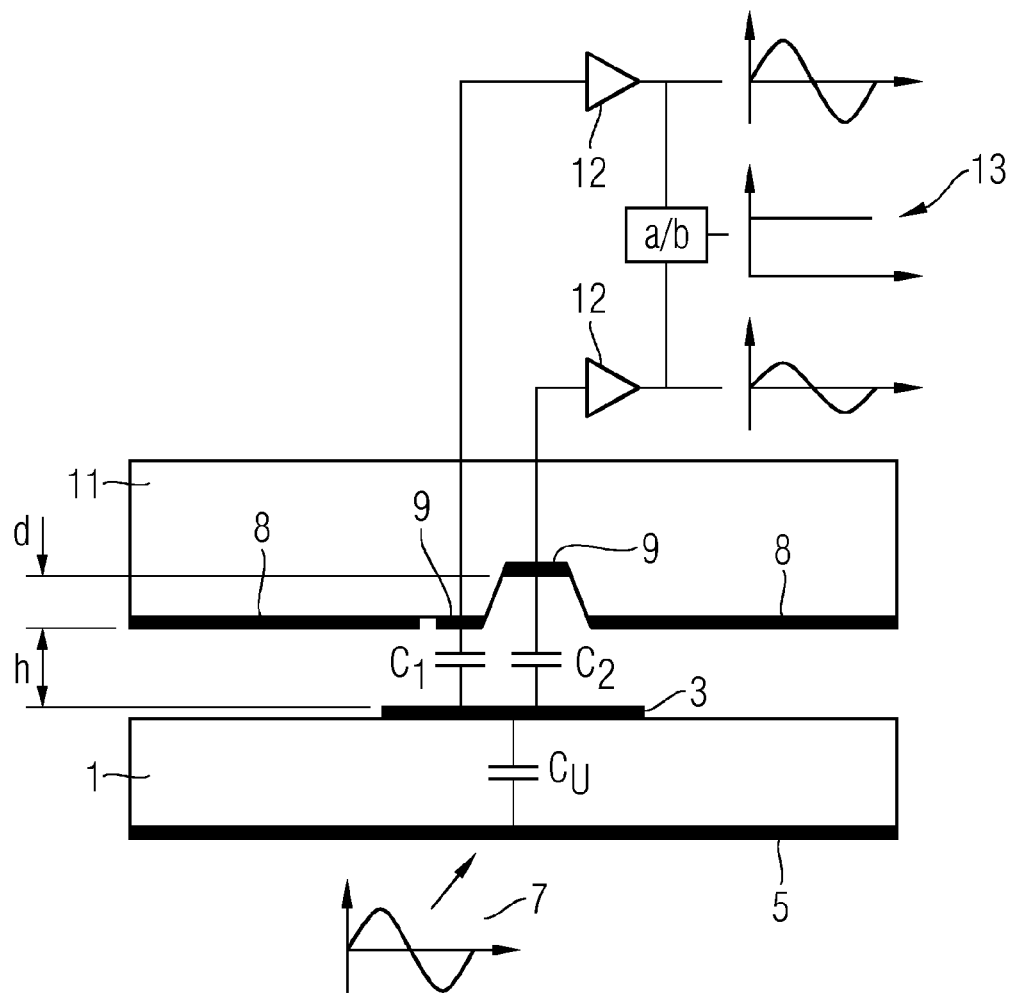
FIG. 3 shows an exemplary embodiment of an apparatus.

FIG. 3 shows an exemplary embodiment of an apparatus.

In the apparatus, use is made of a capacitive sensor which provides at least two separate sensor electrode areas which are parallel to one another and lie alongside one another not in one plane and relative to the structures to be inspected. At the sensor, particularly advantageously a separate sensor electrode is in each case formed on that side of the sensor which faces the structures to be inspected, in order to produce each sensor electrode area. In this case, such a sensor electrode particularly advantageously extends along an x-, y-plane of a Cartesian coordinate system, a spatial extent of the sensor electrode in a z-direction being smaller. This difference can be in the region of, for example, at least one power of ten. For example, a sensor electrode produced in this way can be provided as a sensor electrode layer. A width and depth can be in the millimeters range, and a thickness can be in the micrometers range. A course of a surface of the capacitive sensor that faces the structures to be inspected is designed in such a way that the individual parallel sensor electrode layers are offset with respect to one another in the z-direction and lie alongside one another with respect to an x-, y-plane. A respective sensor electrode or sensor electrode layer is carried by the sensor in such a way that field lines of an electric field end or begin only at that area of the sensor electrode or sensor electrode layer which faces the substrate and extends spatially along the x-, y-plane. Such an area is designated as a respective sensor electrode area. A sensor electrode is therefore particularly advantageously designed as a sensor electrode layer.

A sensor 11 is positioned or moved for measurements at a constant distance above a surface of a substrate 1. In this case, the sensor 11 can rest on an air cushion by an air bearing, for example. This results in a constant average distance, changes in the distance being compensated for, that is to say averaged, by the air bearing. The electrically conductive structure 3 to be measured can, if it exists, be formed on or in the substrate 1. Capacitive couplings C1 and C2 arise between the sensor 11 and the electrically conductive structure 3, which may extend along an area parallel to areas 9 of sensor electrodes of the substrate 1. The capacitive coupling between the sensor electrode 11 and the measurement object 1 and 3 defines the measurement capacitance. This measurement capacitance C1 and C2 is different between a first and a second sensor electrode area 9. Optionally, ground areas 8 can be formed on that side of the sensor 11 which faces the measurement object 1 and 3. The measurement capacitances C1 and C2 are different between the height-offset sensor electrode areas 9. Given otherwise identical conditions, this difference is dependent on the height offset of the sensor electrode areas 9 and the distance between the sensor 11 and the electrically conductive structures 3. Since the height offset d of the sensor electrode areas 9 is known, the distance h between the electrically conductive structures 3 and the sensor 11 can be calculated from the sensor measurement signals. FIG. 3 shows an electrically conductive substrate receptacle which carries and fixes the substrate 1 as a substrate holder 5, to which an excitation signal generated by an excitation signal generating device 7 is applied or to which an excitation signal is fed. The capacitive sensor 11 having at least two sensor electrode areas 9 arranged at mutually different, constant distances from the substrate receptacle 5 is positioned on that side of the substrate 1 which faces away from the substrate receptacle. A measuring device 12 detects a respective sensor measurement signal of the respective sensor electrode area 9, wherein, by an evaluation device 13, a spatial extent of the electrically conductive structure 3 is determined by two signals from the excitation signal and the detected sensor measurement signals.

Only charge-reversal currents can be measured directly by the capacitive sensor 11. The currents are described by the following equation:

$$i = U\frac{dC}{dt} + C\frac{dU}{dt} \qquad (1)$$

The first half of this equation (1) describes the charge-reversal current as a function of the capacitance change over time as the sensor 11 hovers above a substrate 1. The second half describes the charge-reversal current as a function of the voltage change over time. Since a capacitance change typically takes place much more slowly than the applied signal voltage change, the first half of equation (1) can be disregarded in the measurements and the formula changes to equation $$i = C\frac{dU}{dt} \qquad (2)$$

Since the sensor electrodes 9 have a common counterelectrode, the two charge-reversal currents are also dependent on the same voltage or voltage change. Therefore, what remains as the sole different influencing factor between the individual measurement currents is the different measurement capacitances C1 and C2. Since the charge-reversal currents are directly proportional to the measurement capacitances, the ratios of the two charge-reversal currents to one another and of the two measurement capacitances to one another are likewise identical. That is to say that although the measurement capacitances cannot be determined directly, the ratios of the charge-reversal currents and thus of the measurement capacitances can be calculated directly from the charge-reversal currents. To a first approximation, the measurement capacitances between the sensor electrodes and the conductive structures can be described as plate capacitors. The capacitance of a plate capacitor is described by the following formula (3):

$$C = \varepsilon \frac{A}{h} \quad (3)$$

In the case of the offset sensor electrodes, the formula reads approximately:

$$C = \varepsilon \frac{A}{h+d} \quad (4)$$

The ratio of the measurement capacitances is calculated for two sensor electrodes 9 approximately with the formula:

$$V_c = \frac{C1}{C2} = \frac{\varepsilon \frac{A_1}{h}}{\varepsilon \frac{A_2}{h+d}} = \frac{A_1}{A_2} \frac{h+d}{h} \quad (5)$$

Since only approximate values are involved, the latter have to be corrected by a correction factor. Such a correction factor can be determined either by simulations or empirically. A correction factor is distance-dependent and is therefore dependent on the ratio of the measurement capacitances. The formula-based approach with correction term can be specified as follows:

$$V_C = \frac{C_1}{C_2} = \frac{i_1}{i_2} = \frac{A_1}{A_2} \frac{h+d}{h}(1 + k(V_C)) \quad (6)$$

Solving this with respect to the distance h between the electrically conductive structures 3 and the sensor 11 yields the following formula:

$$h = \frac{d}{\frac{V_c}{(1+k(V_c))} \frac{A_1}{A_2} - 1} \quad (7)$$

FIGS. 4A to 4C show exemplary embodiments of measurements. Various electrically conductive structures 3 are illustrated. FIG. 4A shows an electrically conductive structure on a substrate 1, FIG. 4B shows an electrically conductive structure 3 in a substrate 1, and FIG. 4C with an electrically conductive structure 3 at a greater distance h from the sensor 11, the electrically conductive structure 3 likewise being formed in a substrate 1, and FIGS. 4A-4C thus clearly show how the ratio of the two measurement signals changes with the distance h from the electrically conductive area 3. The measurement signals are measured by a measuring device 12 for each sensor measurement signal at a respective sensor electrode 9. An evaluation device 13 can determine the ratio of the two sensor measurement signals, for example. In this way, it is likewise possible to make a statement about the presence or absence of an electrically conductive area. In accordance with this exemplary embodiment, two different dielectrics are present within the distance of the sensor electrodes 9, to be precise air and the substrate 1. The use of different dielectrics brings about an effectively greater distance d. This should also be taken into account in the calculation of the distance h. In order to keep the resulting formula simple, the derivation in conjunction with FIG. 3 was calculated with one dielectric in a simplifying manner. In principle, however, the method can likewise be implemented with different dielectrics.

Figure 5:
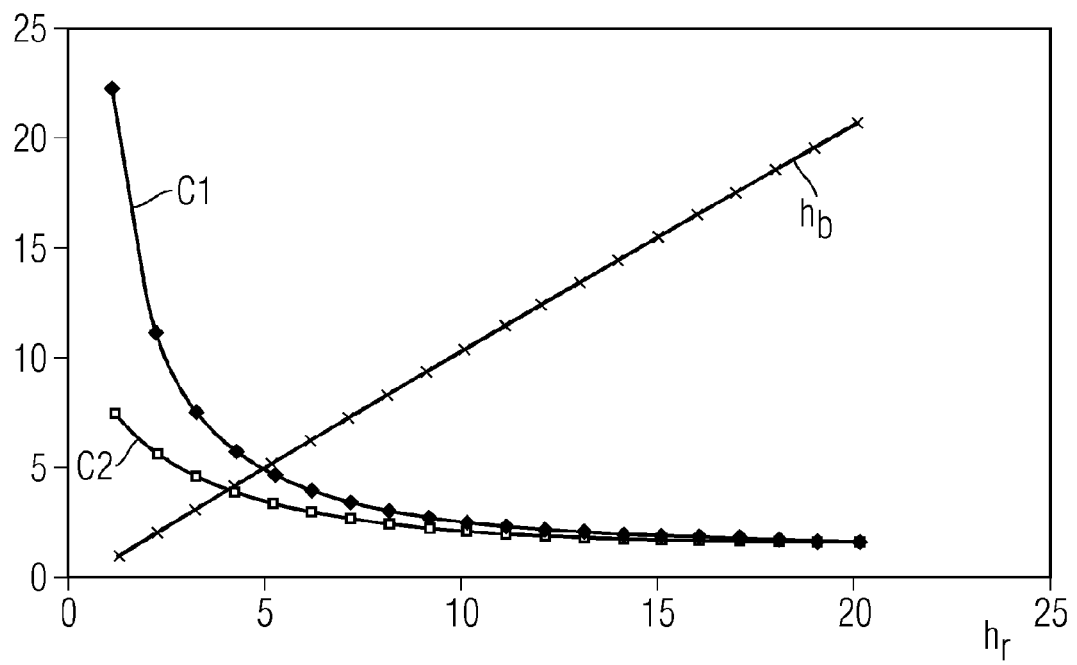
FIG. 5 shows an exemplary embodiment of a distance calculation.

FIG. 5 shows an exemplary embodiment of a distance calculation by simulated plate-capacitor capacitances. FIG. 5 shows a simulation. The illustration shows the two plate capacitances C1 and C2 with respect to the substrate 1 and the calculated distance $h_b$ against the actual distance $h_r$. The capacitance values C1 and C2 were calculated using the plate capacitor formula, and so these values are not identical to the real values. This simulation was calculated using d=2 µm as sensor height offset and 2500 µm² as sensor areas.

Figure 6:
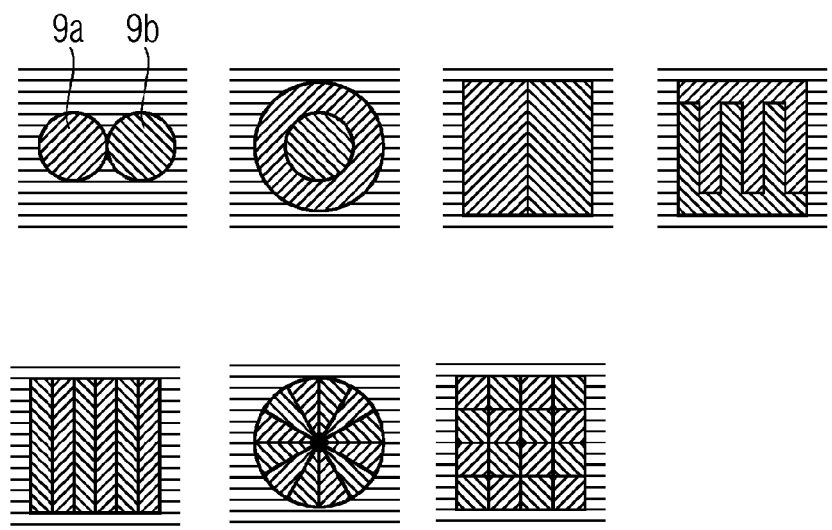
FIG. 6 shows exemplary embodiments of advantageous sensor electrodes.

FIG. 6 shows exemplary embodiments of advantageous sensor electrode areas 9. In order that the sensor electrode areas 9 are subject to identical measurement conditions and the measurement is not corrupted, the individual sensor electrode areas 9 must overlap effectively identically sized substrate area portions of one and the same electrically conductive structure 3. Ideally, the geometries of two measurement electrode areas 9 are adapted to the geometrical structure of the substrate 1. FIG. 6 shows advantageous geometries in the case of a configuration with two sensor electrode areas 9. FIG. 6 shows exemplary embodiments of possible configurations of sensor electrode areas 9. The obliquely hatched areas represent two mutually height-offset sensor electrode areas 9a and 9b.

The above calculations and figures deal in each case with only two sensor electrode areas 9. However, the scope of protection of this application likewise encompasses embodiments with more than two sensor electrode areas.

Figure 7A:
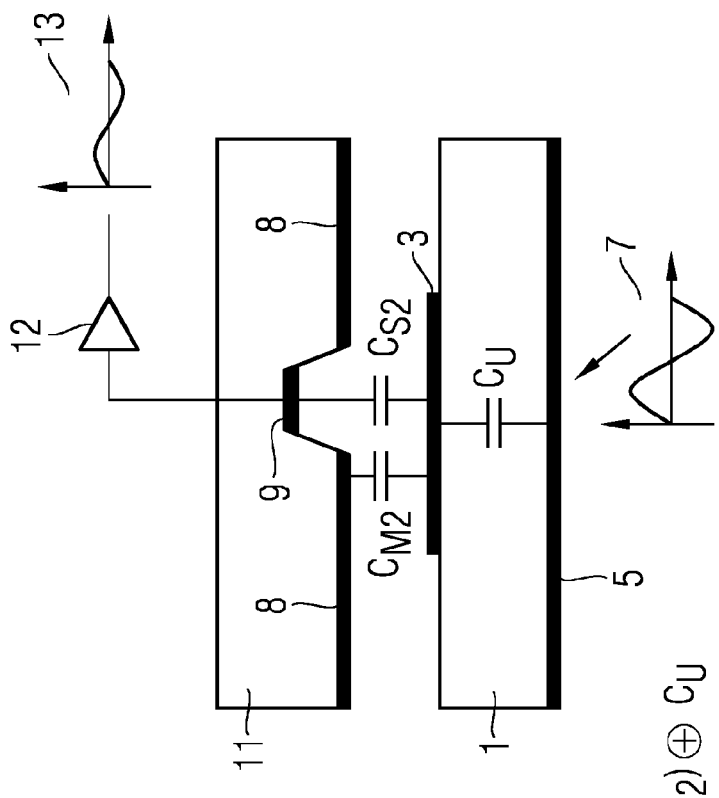
FIGS. 7A and 7B show two measurement examples of a method.
Figure 7B:
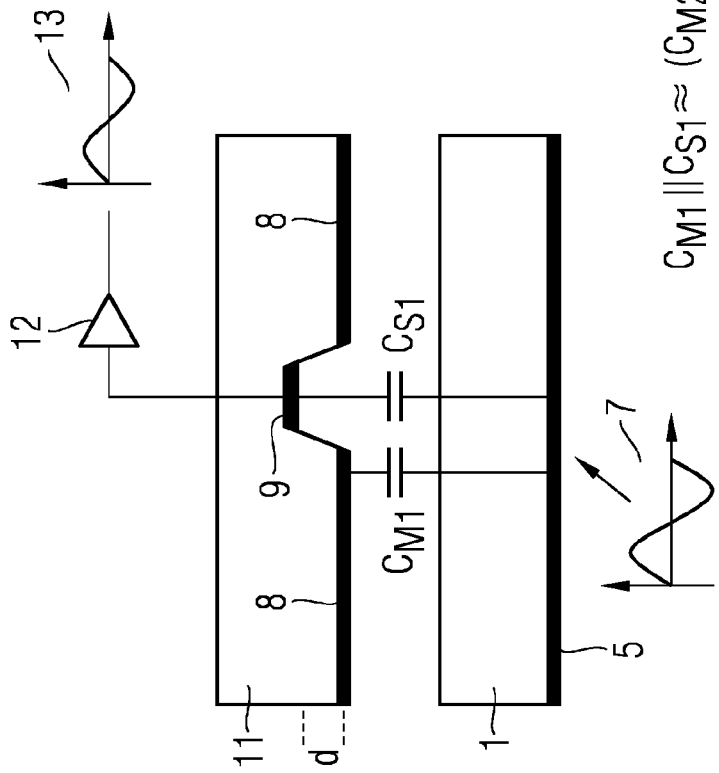

FIGS. 7A and 7B show two measurement examples of a method for the contactless and nondestructive inspection of a multiplicity of electrically conductive structures 3. First, S1 involves providing an electrically conductive substrate receptacle, which makes contact with and positions the substrate 1 and to which an excitation signal generated by an excitation signal generating device 7 is applied. Second, S2 involves arranging a capacitive sensor 11 having, on that side of the substrate 1 which faces away from the substrate receptacle, two sensor electrode areas 9 arranged at mutually different, constant distances from the substrate receptacle. In accordance with this exemplary embodiment, the sensor electrode area 9 which is closest to the substrate 1 is simultaneously formed as a ground area 8. Third, S3 involves measuring respective sensor measurement signals, which are advantageously charge-reversal currents, at a respective sensor electrode area 9 by a measuring device 12. Fourth, S4 involves evaluating the two sensor measurement signals by an evaluation device 13. With such a method, for example, the following measurements can be carried out:

a) Topography measurement:

By moving the sensor 11 in an X-direction and a Y-direction, it is possible to effect scanning over the entire substrate 1. In this way it is possible to measure, inter alia, a topography of an object to be measured or of structures 1 and 3.

b) Checking whether a conductor track is present or absent, or measuring the lateral geometry of a conductive area:

Such a measurement of, in particular small, structures can likewise be effected by a sensor 11 having only one sensor electrode area 9. This sensor electrode area 9 must then be offset relative to a ground area 8. In this case, the ground area 8 then performs the function of the second sensor electrode area 9. FIG. 7A shows a first case, in which no electrically conductive structure is arranged below the sensor 11. If no electrically conductive structure is arranged below the sensor 11, both the ground area 8 and the sensor electrode area 9 couple to the substrate receptacle, which can be embodied as a chuck, for example, with approximately the same capacitance per unit area. The capacitances per unit area are approximately identical in magnitude, since the comparatively small height offset d between electrode area 9 and ground area 8 is negligible relative to the distance from the substrate receptacle. Correspondingly, the current per unit area is likewise approximately identical in magnitude. FIG. 7b shows the second case, in which an electrically conductive structure 3 is arranged below the sensor 11. As soon as an electrically conductive structure 3 is positioned below the sensor electrode 11, the latter forms an equipotential surface. In this case, the total capacitance between the substrate receptacle and the sensor 11 does not change appreciably, because corresponding conductive areas, which are for example merely vapor-deposited, are generally very thin and thus only minimally shorten the effective distance between the sensor 11 and the substrate receptacle or substrate holder 5. However, there is a change in the capacitance ratios between the conductive structure 3, which forms an equipotential surface, and the sensor electrode area 9 and the ground area 8, respectively. This is caused by the fact that the offset d of the sensor electrode area 9 can no longer be disregarded relative to the distance h between the sensor 11 and the electrically conductive structure 3. The ratio of the currents per unit area corresponds to the ratio of the capacitances per unit area, while the total current almost does not change. Consequently, in the case of an upper sensor electrode area 9 in accordance with FIGS. 7A and 7B, less current flows if an electrically conductive structure 3 is situated below the sensor electrode area 9. Therefore, the structures 3 and the lateral dimensions thereof can be inspected by way of the current intensity.

The exemplary embodiments described here show an offset d upward. Alternatively, the offset d can likewise be formed downward. In such a case, the ratio of the capacitances and currents changes accordingly. The two cases illustrated in FIG. 7 are additionally described mathematically in FIGS. 7A and 7B.

In the apparatus for simple and reliable contactless and nondestructive inspection of electrically conductive, in particular insulated, structures 3 produced on or in a substrate 1 or in a floating manner in a substrate 1, use is made of a capacitive sensor 11 having at least two sensor electrode areas 9 which are arranged at mutually different, constant distances parallel to a surface of the substrate 1 and alongside one another with respect to the surface.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. An apparatus for the capacitive, contactless and nondestructive inspection of a multiplicity of electrically conductive structures produced in a substrate using an excitation signal generated by an excitation signal generating device, comprising an electrically conductive substrate holder, which positions the substrate and to which the excitation signal generated by the excitation signal generating device is applied;

a capacitive sensor, disposed on a side of the substrate facing away from the substrate holder and having at least two sensor electrode areas arranged at mutually different, constant distances parallel to the surface of the substrate and alongside one another relative to the surface of the substrate;

a measuring device detecting respective sensor measurement signals at respective sensor electrode areas; and an evaluation device determining a spatial extent of an electrically conductive structure based on the sensor measurement signals.

2. The apparatus as claimed in claim 1, wherein the capacitive sensor has two sensor electrode areas and the evaluation device has a divider and determines a distance between the capacitive sensor and the electrically conductive structure by a ratio of the sensor measurement signals to one another.

3. The apparatus as claimed in claim 2, wherein the evaluation device determines whether the electrically conductive structure extends between one of the sensor electrode areas and the substrate holder.

4. The apparatus as claimed in claim 3, wherein the evaluation device, upon determining a distance greater than a threshold value, determines that no electrically conductive structure extends between one of the sensor electrode areas and the substrate holder.

5. The apparatus as claimed in claim 1, wherein in a plane of one of the sensor electrode areas, at least one electrically conductive shielding layer is formed on the capacitive sensor.

6. The apparatus as claimed in claim 5, wherein the at least one electrically conductive shielding layer replaces the sensor electrode area in the plane of the one of the sensor electrode areas.

7. The apparatus as claimed in claim 1, wherein the excitation signal is an alternating voltage and/or current signal.

8. The apparatus as claimed in claim 1, wherein each of the sensor measurement signals is a charge-reversal current.

9. The apparatus as claimed in claim 1, wherein the sensor electrode areas and the electrically conductive structures extend parallel to an x,y plane of an orthogonal coordinate system.

10. The apparatus as claimed in claim 9, wherein the sensor electrode areas are identical in size.

11. The apparatus as claimed in claim 10, wherein the sensor electrode areas are congruent to one another.

12. The apparatus as claimed in claim 11, wherein the sensor electrode areas together correspond to the surface of the substrate.

13. The apparatus as claimed in claim 1, wherein the substrate is a screen glass substrate of a liquid crystal display and the electrically conductive structures are conductor tracks or pixel areas.

14. The apparatus as claimed in claim 1, further comprising a relative movement device relatively moving the surface of the substrate and the capacitive sensor at a constant distance with respect to one another into a multiplicity of measurement positions.

15. The apparatus as claimed in claim 14, wherein the capacitive sensor has a multiplicity of groups of sensor electrode areas, across from the surface of the substrate, formed in a regular pattern, and simultaneously provides a multiplicity of measurement positions.

16. The apparatus as claimed in claim 15, wherein the regular pattern extends linearly relative to the substrate.

17. A method for the capacitive, contactless and nondestructive inspection of a multiplicity of electrically conductive structures produced on or in a substrate, comprising:

positioning the substrate by an electrically conductive substrate holder, to which an excitation signal generated by an excitation signal generating device is applied;

positioning a capacitive sensor on a side of the substrate facing away from the substrate holder, the capacitive sensor having at least two sensor electrode areas arranged at mutually different, constant distances with respect to the surface of the substrate and alongside one another relative to the surface of the substrate;

detecting respective sensor measurement signals at respective sensor electrode areas by a measuring device;

determining, by an evaluation device, a spatial extent of an electrically conductive structure based on the sensor measurement signals.

18. The method as claimed in claim 17, wherein the capacitive sensor has two sensor electrode areas and the evaluation device has a divider and determines a distance between the capacitive sensor and the electrically conductive structure by a ratio of the sensor measurement signals to one another.

19. The method as claimed in claim 18, wherein the evaluation device determines whether the electrically conductive structure extends between one of the sensor electrode areas and the substrate holder.

20. The method as claimed in claim 19, wherein the evaluation device, upon determining a distance greater than a threshold value, determines that no electrically conductive structure extends between one of the sensor electrodes and the substrate holder.

21. The method as claimed in claim 17,
wherein, in a plane of one of the sensor electrode areas, at least one electrically conductive shielding layer is formed on the capacitive sensor, and
further comprising applying a ground potential to the electrically conductive shielding layer.

22. The method as claimed in claim 21, wherein the at least one electrically conductive shielding layer replaces the one of the sensor electrode areas lying in the plane of the one of the sensor electrode areas.

23. The method as claimed in claim 17, wherein an alternating voltage and/or current signal is impressed as the excitation signal.

24. The method as claimed in claim 17, wherein each of the sensor measurement signals is a charge-reversal current.

25. The method as claimed in claim 17, wherein the sensor electrode areas and the electrically conductive structures extend parallel to an x,y plane of an orthogonal coordinate system.

26. The method as claimed in claim 25, wherein the sensor electrode areas are identical in size.

27. The method as claimed in claim 26, wherein the sensor electrode areas are congruent to one another.

28. The method as claimed in claim 27, wherein the sensor electrode areas together correspond to the surface of the substrate.

29. The method as claimed in claim 17, wherein the substrate is a screen glass substrate of a liquid crystal display and the electrically conductive structures are conductor tracks or pixel areas.

30. The method as claimed in claim 17, further comprising relatively moving, by a relative movement device, the surface of the substrate and the capacitive sensor at a constant distance with respect to one another into a multiplicity of measurement positions.

31. The method as claimed in claim 30, wherein the capacitive sensor has a multiplicity of groups of sensor electrode areas, across from the surface of the substrate, formed in a regular pattern, and simultaneously provides a multiplicity of measurement positions.

32. The method as claimed in claim 31, wherein the regular pattern extends linearly relative to the substrate.

* * * * *